United States Patent [19]

Woodman, Jr.

[11] 4,063,347
[45] Dec. 20, 1977

[54] MACHINE FOR INSERTING MULTI-LEAD COMPONENTS SEQUENTIALLY

[75] Inventor: Daniel Wayne Woodman, Jr., Beverly, Mass.

[73] Assignee: USM Corporation, Boston, Mass.

[21] Appl. No.: 728,835

[22] Filed: Oct. 1, 1976

[51] Int. Cl.² .............................................. B21F 1/02
[52] U.S. Cl. .................................. 29/564.1; 29/703; 29/741; 29/809; 140/147
[58] Field of Search ............ 29/33 M, 33 K, 701–704, 29/741, 809, 816, 564.1, 564.2; 221/10; 140/147, 105

[56] References Cited

U.S. PATENT DOCUMENTS

| | | | |
|---|---|---|---|
| 3,570,099 | 3/1971 | Ackerman et al. | 29/564.1 |
| 3,591,911 | 7/1971 | Goldschmied | 29/564.1 X |
| 3,687,172 | 8/1972 | Suverkropp | 140/147 |
| 3,727,284 | 4/1973 | Ragard et al. | 29/564.1 X |
| 3,880,205 | 4/1975 | Linker et al. | 140/147 |

Primary Examiner—J. M. Meister
Attorney, Agent, or Firm—Carl E. Johnson; Richard B. Megley; Vincent A. White

[57] ABSTRACT

Electronic components, such as DIP's, which have at least one row of generally right angular or generally linear leads projecting from their bodies, are dispensed from their respective columns in a magazine of the machine, one by one, and as predeterminedly selected by a picker controlled by computer means. Due to occasional obstructive slight irregularities in the formation of the bodies and/or their leads, means is provided to insure exact registration of each selected component with a component inserting mechanism. Improved means for rapid, reliable release and transfer of the successive selected components from the magazine, and between the delivery ends of its respective columns and, a lead conditioning means at the locality of such registration, enable efficient coordination with the inserting mechanism whereby continuous output at a higher rate is attainable.

11 Claims, 16 Drawing Figures

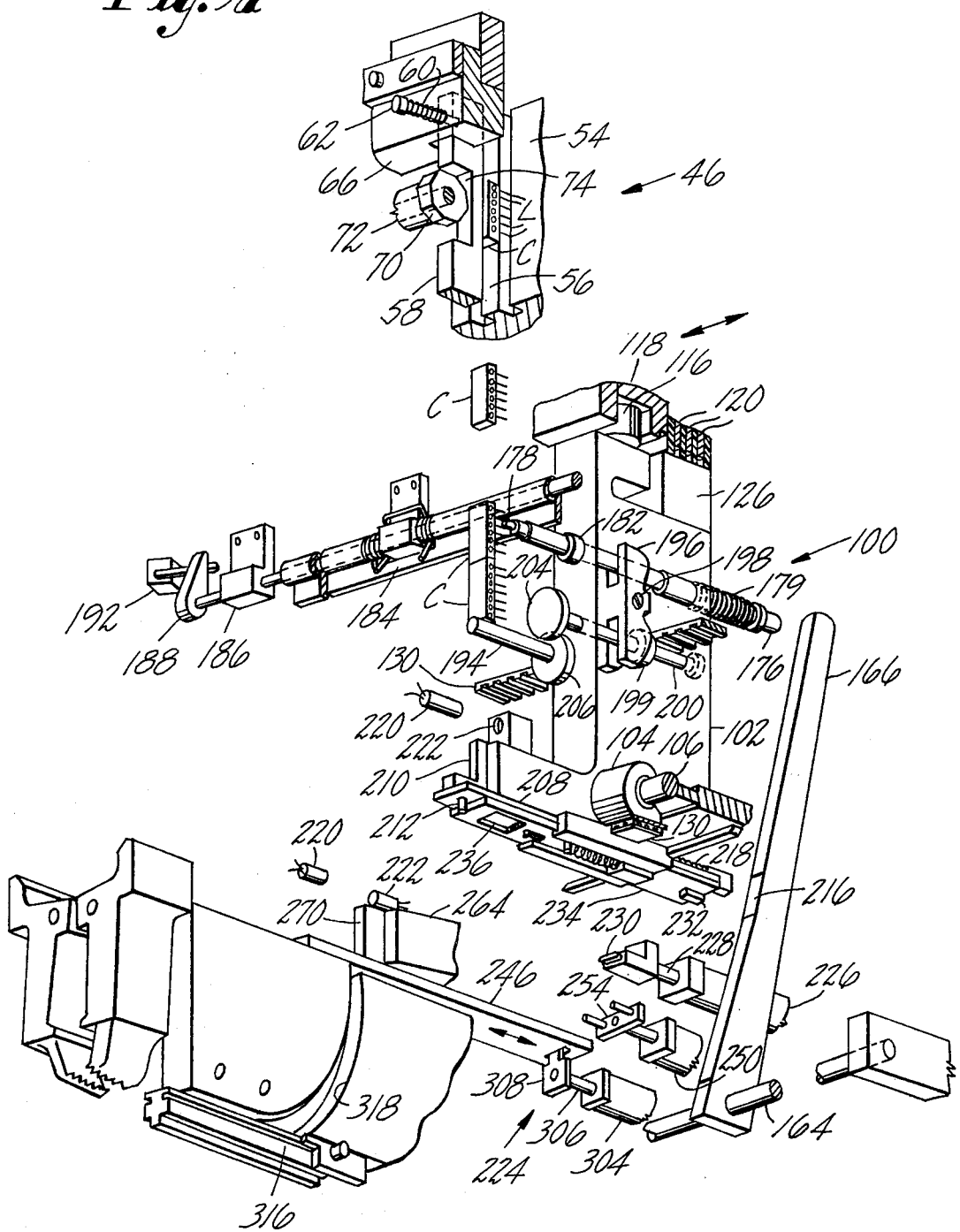

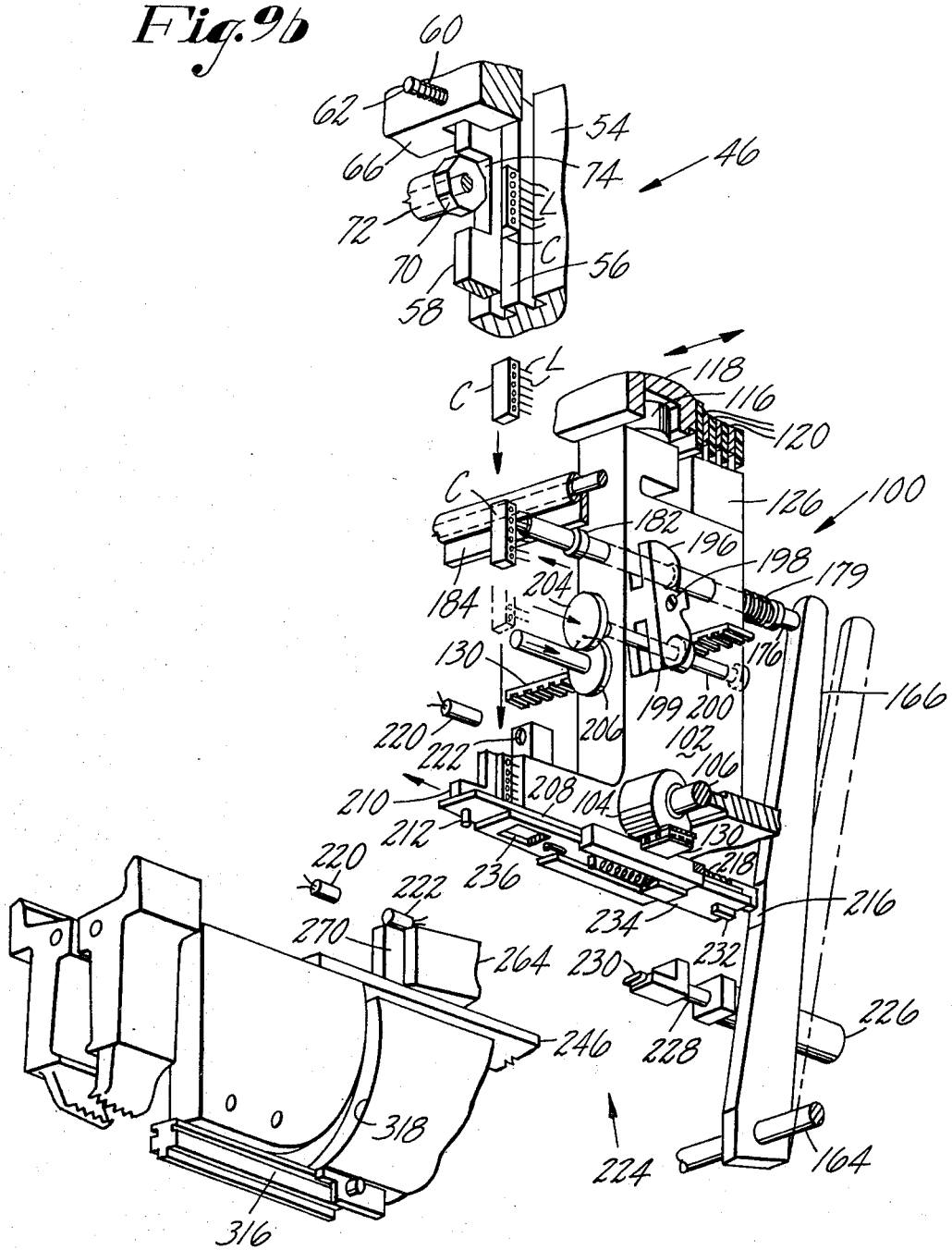

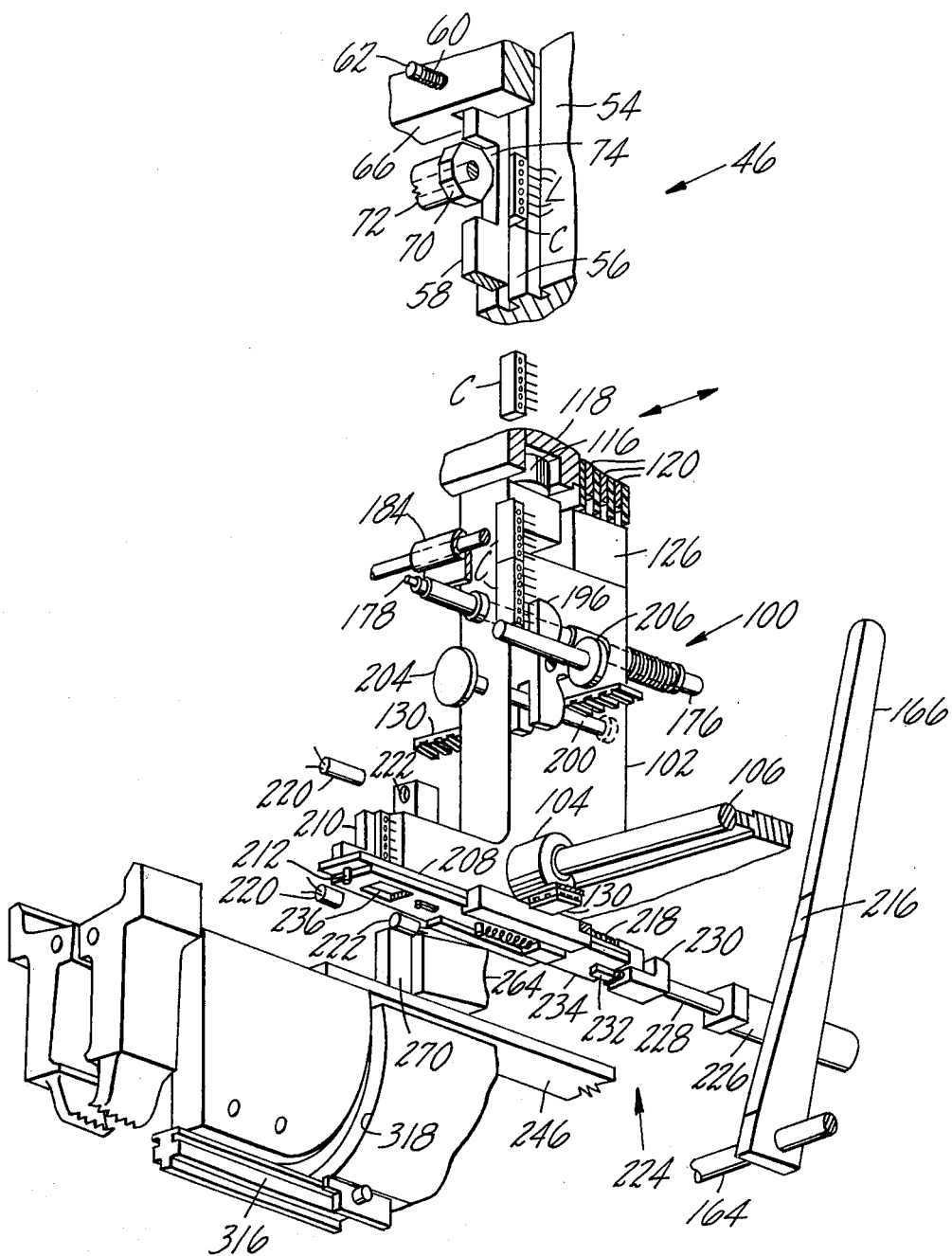

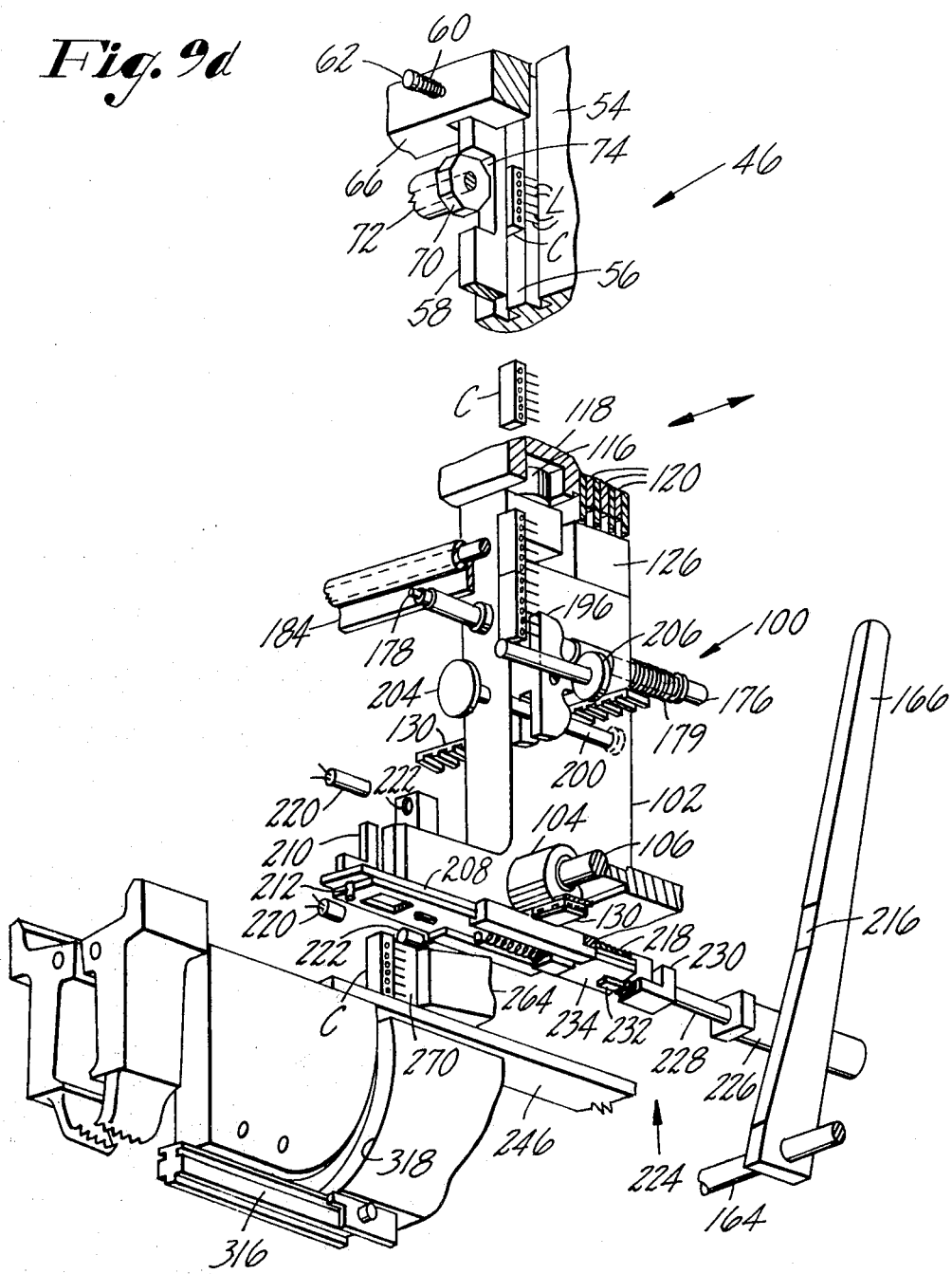

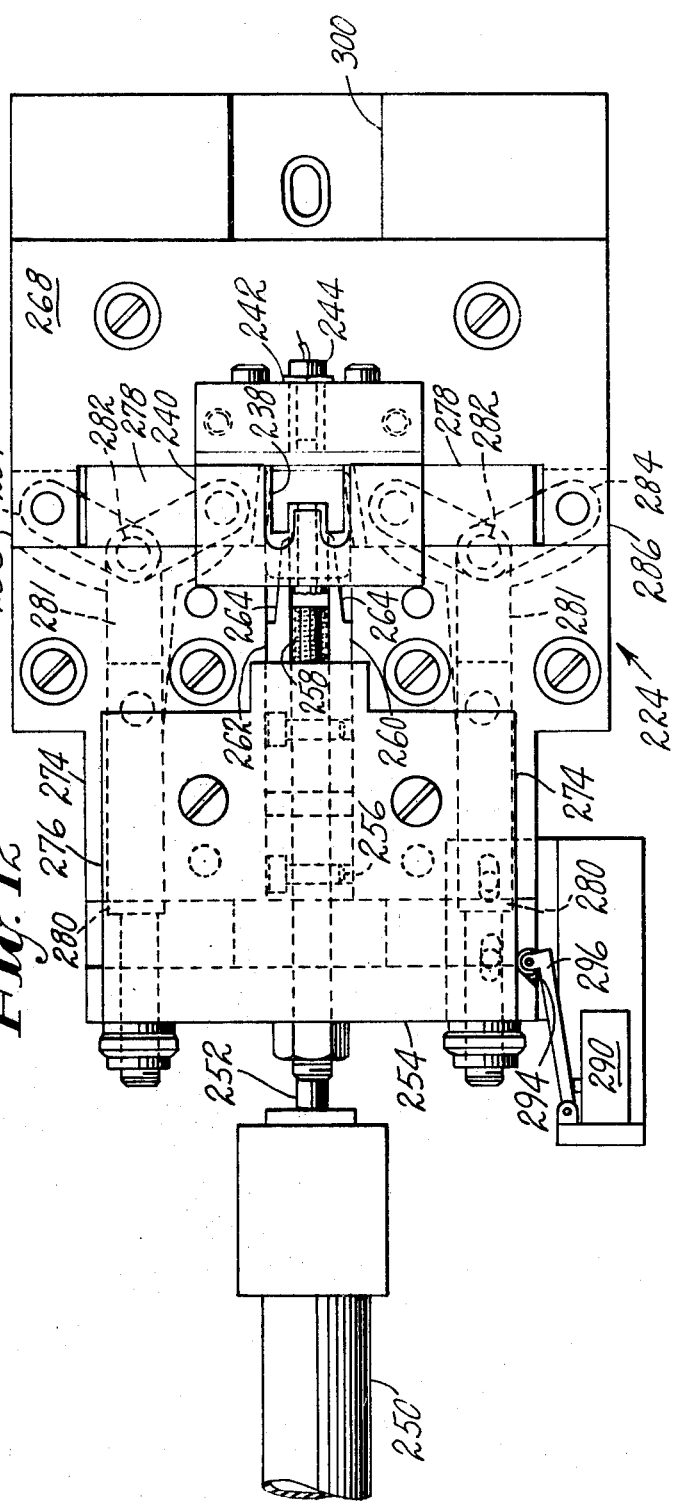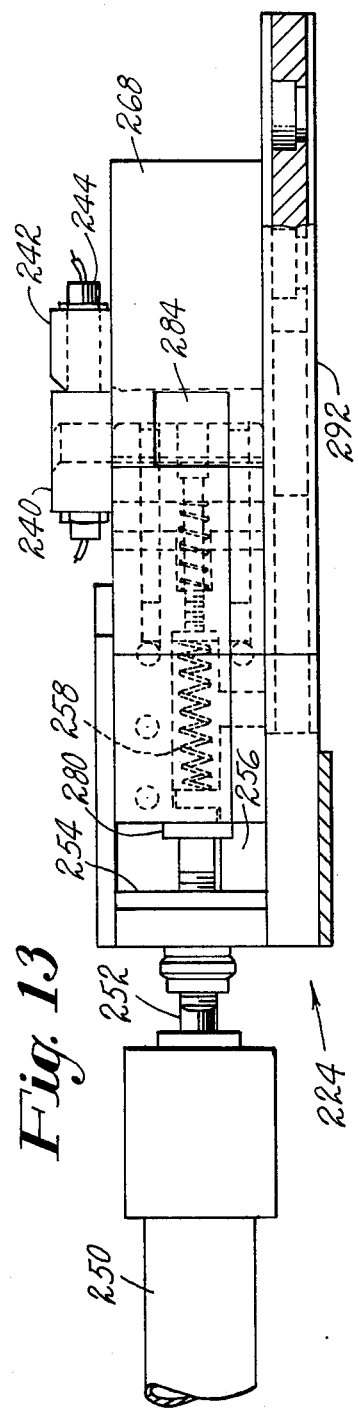

MACHINE FOR INSERTING MULTI-LEAD COMPONENTS SEQUENTIALLY

BACKGROUND OF THE INVENTION

Multi-lead components, such as those of the type commonly designated "DIP" wherein the leads extend in dual in-line relation, have hitherto been processed and inserted into circuit boards by machines disclosed, for instance, in the U.S. Pat. No. 3,591,040 issued in the name of Arther Lambert. In that patent (as well as earlier U.S. Pat. No. 3,550,238 to Lambert et al.) the components are selectively aligned with inserting mechanism by appropriately shifting a magazine and releasing them singly to, and for mounting by, the inserting mechanism after their leads have been straightened, if necessary. When a larger variety or larger supply of components is required to be available for circuit board mounting, it becomes more practicable to hold the larger magazine stationary and employ a relatively shiftable means for transferring each component as it is released from a selected channel of the magazine to be positioned in operative relation to an appropriate inserting device. Machines of this general type are disclosed, for example, in U.S. pat. Nos. 3,442,430 and 3,727,284. Unfortunately, as the quantity and variety of dual in-line (and single in-line components or the like) proliferate to meet circuit requirements, what formerly was regarded as only an occasional small irregularity in the formation of a component body and/or misalignment of its leads can cause more serious disruption of the machine operation by reason of the jamming of leads, or result in a non-insertion or improper mounting of a component and hence a damaged or useless circuit board assembly. It has become a critical problem properly to allow for dimensional and shape variations, for instance those due to body molding flashing, and especially is it desirable to avoid raceway jamming due to overlapping of adjacent end portions or end flashing on the components. It follows that to deal effectively and rapidly with more different components (DIP's for instance, which may look alike but have very dissimilar electronic characteristics), better techniques must be incorporated which insure precise, reliable control over each component as it is processed from its magazine source to final delivery for accurate circuit board installation.

Illustrative of the present invention, about sixty or more component magazine raceways are linearly disposed to be serviced by a computer controlled picker mechanism delivering the successively selected DIP's to a central illustrative DIP inserter mechanism. Presence and position or condition of each component is monitored prior to delivery by the picker mechanism. Preferably the computer determining the order of component selection also regulates Y-Y and possibly X,Y and Z positioning of the circuit board to receive them.

SUMMARY OF THE INVENTION

A general object of this invention is to provide an improved inserting machine for dealing with in-line lead type components having computer controlled mechanism for selecting the sequence of components to be mounted, and automatic component handling, monitoring, and adjusting devices for insuring the actual delivery and insertion of such components whereby the integrity of a circuit of which they are to be comprised is maintained.

A further object of the invention is to provide an improved DIP-inserting machine capable of rapidly and reliably straightening and mounting the in-line leads of the components as successively selected by pre-programmed means from a large supply source and regardless of small initial deviations in the component body or lead configurations.

Another object of this invention is to provide a multi-lead component inserting machine, of the type having a belt driven shuttle-like picker servicing a multi-raceway magazine, with improved monitoring and adjusting mechanisms including means for conforming leads of the components released from their raceways and to assure component passage in selected, rapid succession through the picker and the lead conforming means, and thence to proper positioning with respect to inserting instrumentalities.

Another object of the invention is to provide in a versatile DIP mounting machine an improved picker assembly capable of automatically selecting DIP's from a large number of different, adjustable channels or raceways in selected predetermined order, the machine to include novel features whereby continuous positioning control of the DIP's in the raceways and until the moment of individual mounting is assured.

To these ends, and as shown herein, the invention features a plurality of raceways respectively having sides slidably engaged by the different bodies of components to be successively released therefrom upon demand, a picker assembly automatically shiftable to cooperate with the delivery ends of the raceways, and a manually controlled graded cam means engageable with a corresponding movable side of the respective raceways for adjustably positioning it and thus determining their cross-sectional passageways as appropriate to continuous feeding therein of the different component body shapes.

A further novel feature resides in the provision of improved mechanism for uniformly positioning the leads commonly divergent from opposite sides of each body (desirably by about 7° or 8°) while avoiding jamming and accurately registering it for reception in the inserting mechanism. This improvement, seemingly minor in nature, is in fact of considerable importance. It arises from realization that DIP body thickness variation often prevents uniform lead spacing simply by biasing leads apart when their body abuts a fixed gauge member. Accordingly, as herein illustrated, each body abuts a gauge yieldable in the thickness direction to a fixed operating position wherein opposed inwardly movable formers, not being inhibited by interference from and thus positioned body, displace the leads inwardly, if necessary, against parallel confronting surfaces to the degree of uniform divergence required.

BRIEF DESCRIPTION OF THE DRAWINGS

The foregoing and other features of the invention, together with various novel details and combinations of parts, will now be more particularly described in connection with an illustrative embodiment, and with reference to the accompanying drawings thereof, in which:

FIGS. 9A-9D are progressive perspective views schematically indicating the positions of parts controlling delivery of the selected component to the lead forming and inserting means;

FIG. 12 is a plan view of DIP lead forming or straightening means; and

FIG. 13 is a view in side elevation of the means shown in FIG. 12.

DESCRIPTION OF THE PREFERRED EMBODIMENT

Figure 1:
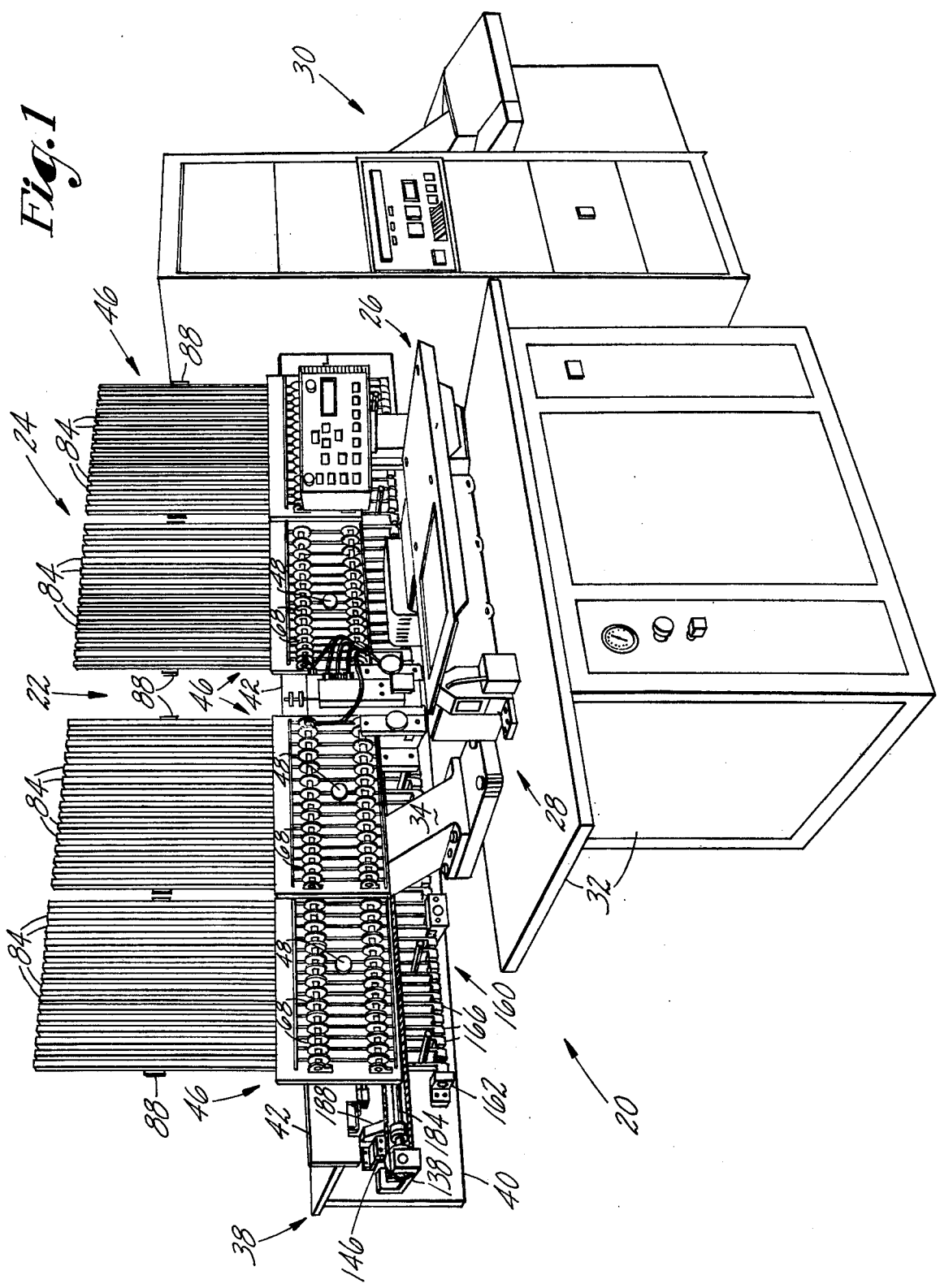
FIG. 1 is a perspective view of a DIP sequencing and inserting machine including clinching mechanism, and computer-controlled mechanism for selection of components from their magazine raceways as well as X-Y positioning of circuit boards adapted to receive the multi-leaded components.
Figure 2:
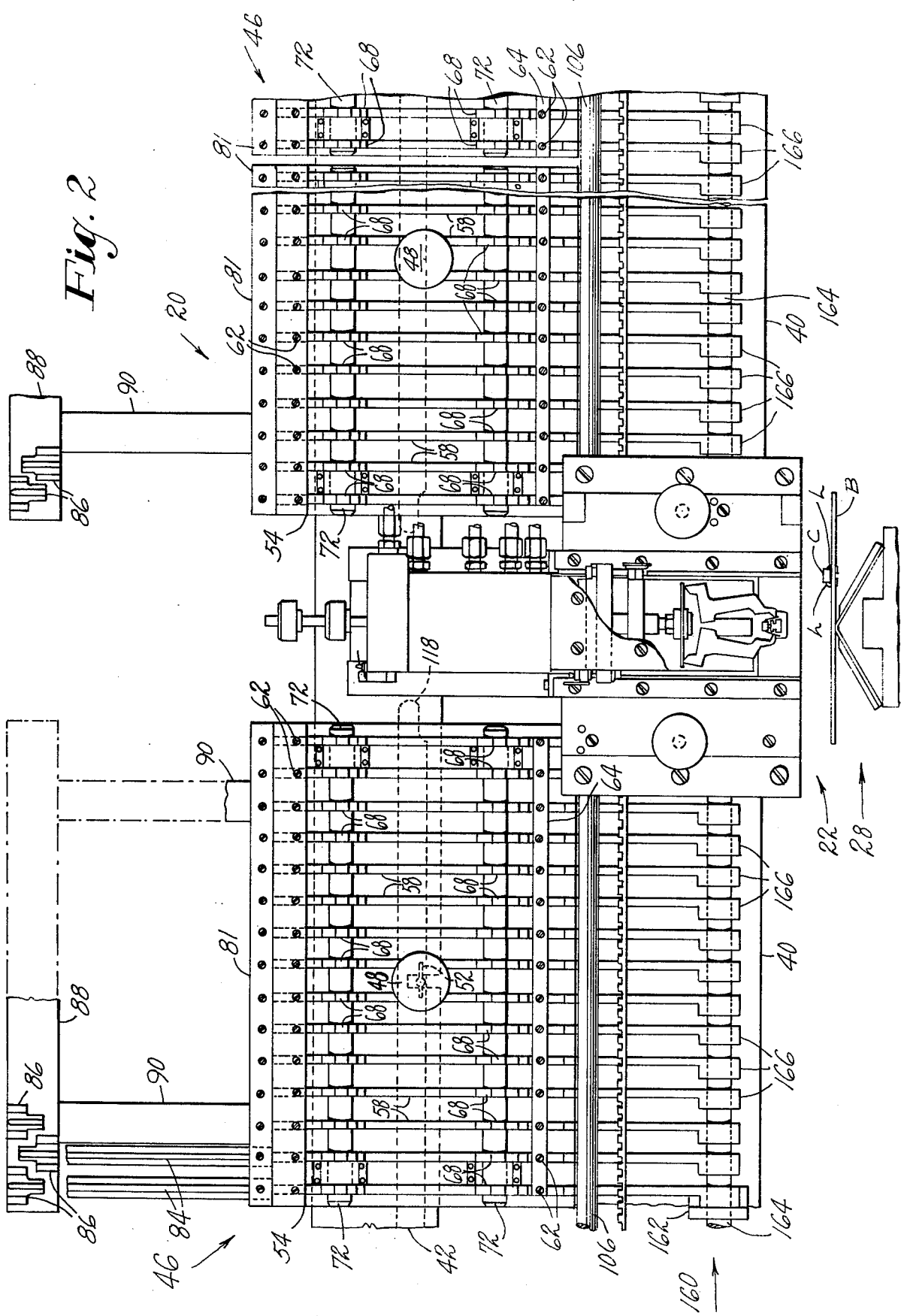
FIG. 2 is a view in enlarged front elevation of an upper portion of the machine shown in FIG. 1, with portions broken away, and showing magazine sections, a central component inserting head and lead clinching mechanism, and a circuit board portion in which a DIP has been mounted by the machine.

Referring to FIG. 1, a machine generally designated 20 comprises a DIP inserting head 22 which, except for an improved lead conditioning means associated therewith and subsequently to be described, largely corresponds to the head disclosed in the mentioned U.S. Pat. No. 3,591,040, a multi-sectioned magazine 24 for supplying in-line lead components such as DIP's designated C (FIGS. 2,7,9A-D) to be mounted in a circuit board B (FIG. 2), an X-Y cross-side mechanism 26 for supporting and positioning the board, cut-clinch mechanism generally designated 28, and a numerical positioning control means such as a computer or tape reader 30. The cut-clinch mechanism 28 may, for instance, correspond to pending application Ser. No. 635,732 and is desirably mounted on a bench 32 in vertical alignment with the head 22 and beneath the cross-slide mechanism 26.

Figure 3:
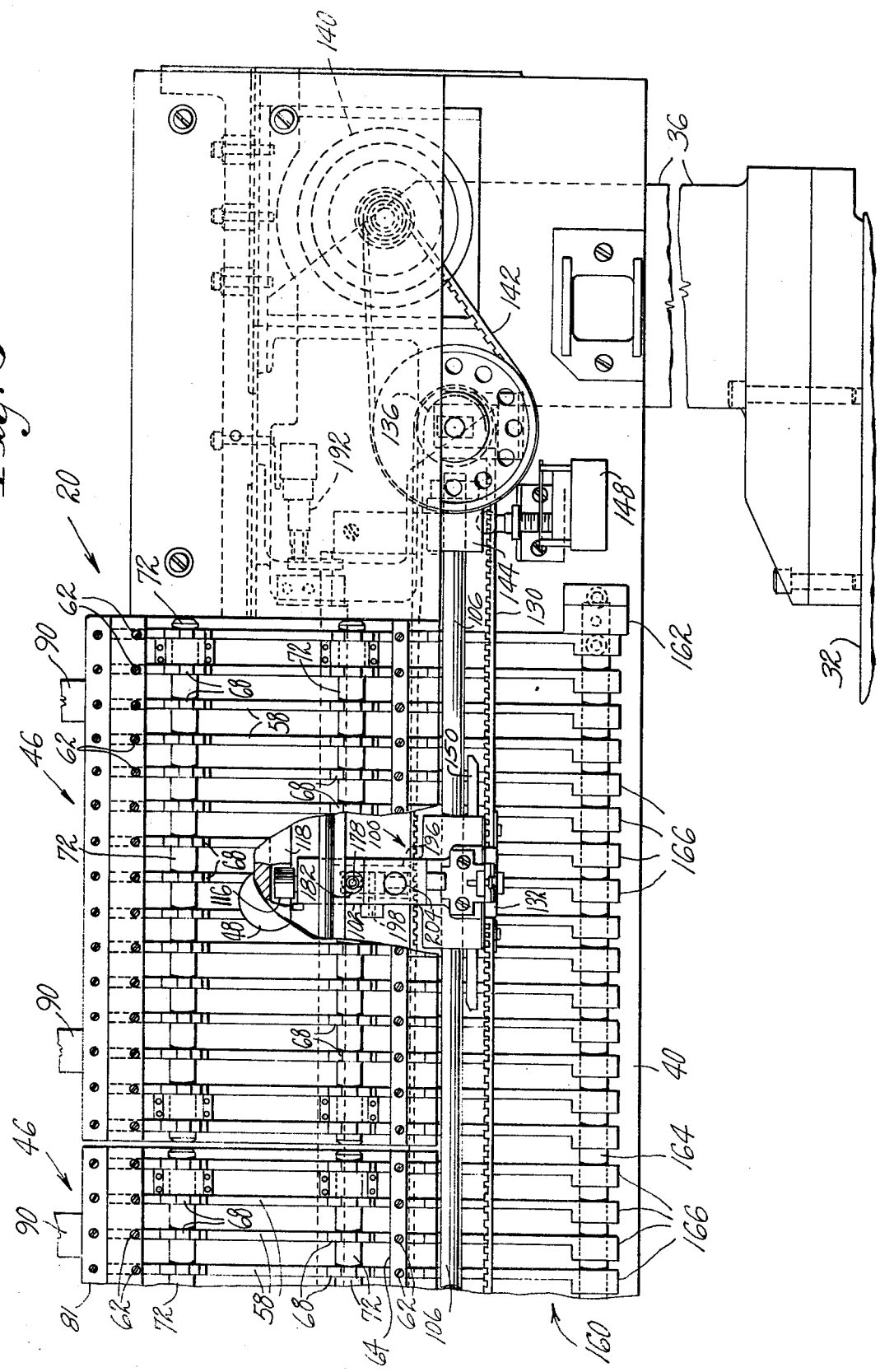
FIG. 3 is a view similar to a right hand portion of the magazines shown in FIG. 2, and additionally showing a picker assembly and power means for laterally shifting it as programmed.
Figure 5:
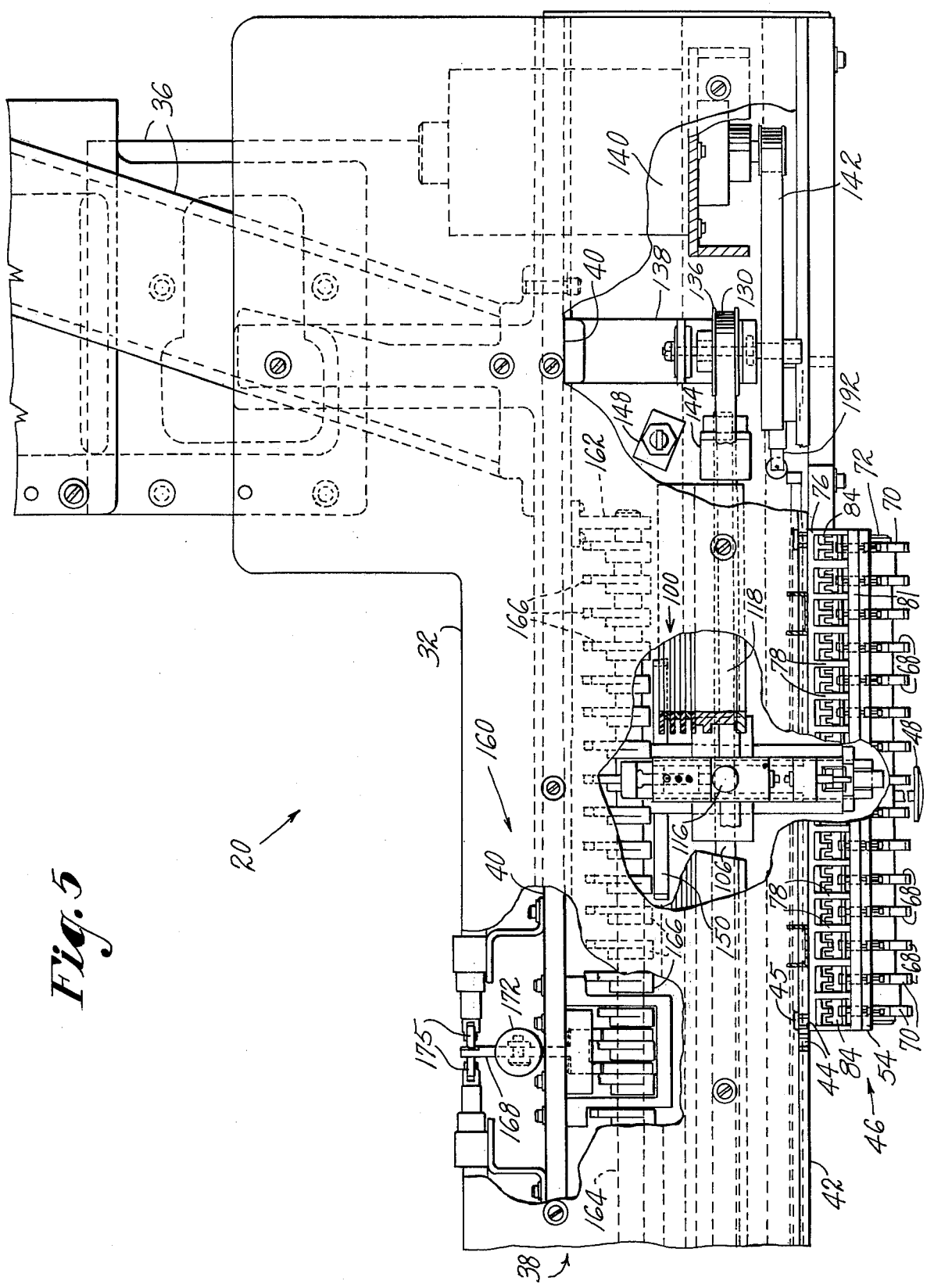
FIG. 5 is a top plan view of the mechanism largely shown in FIGS. 3 and 4, with portions broken away, and showing a series of escapement levers simultaneously actuatable and one of which is effective with the picker assembly to control release of successive selected components from the respective raceways of the magazine to the picker assembly.

Bracketed to the top rear of the bench 32 is a pair of spaced, upstanding, hollow castings 34,36 (FIG. 1, 3 and 5) which support an elongated, horizontal semi-enclosure or frame generally designated 38 for most of the mechanism hereinafter to be more fully explained. A flat, vertical plate 40 (FIGS. 1,2,3,5,6 and 8) of the frame 38 extends about equally from opposite sides of the head 22 and has a cut-away portion accommodating a portion of the latter. In the illustrative embodiment the plate 40 has bolted to its upper edge and the castings 34,36 a flanged support 42 (FIGS. 6-8) in the sectional shape of a T. V-notches 44 (FIG. 5) spaced in the upper edge of the flange portion of the support 42 are provided for receiving in detachable, suspended relation rearwardly projecting headed studs 45 of a series of magazine assemblies respectively generally designated 46 (FIGS. 1,2,6,8), in this instance four in number. Each magazine assembly 46 in securable in its suspended position but easily demountable by means of a spring-pressed clamping knob 48 (FIGS. 2 and 6) having a plunger stem extending rotatably through the magazine and through an elongated slot in the flange portion of the support 42, the stem carrying at its inner end a compression spring 50 for urging a cross-pin 52 (FIG. 6), when this pin transversely spans the slot, into clamping relation to the support 42.

In the present embodiment each magazine 46 includes fifteen numerically identified raceways but it will be apparent any suitable number providing adequate total component capacity may be provided. The DIP components to be inserted may be of dissimilar size and electronic characteristics or they may, in more than one raceway, be identical to insure ample supply of even the most often employed DIP categories. As shown in FIGS. 3,5,6,8, and 9, each magazine 46 comprises a vertically slotted backing or raceway plate 54, the slots respectively receiving the in-line DIP leads, and a guiding land 56 intermediate adjacent slots being arranged to be slidably engaged by the inner side of the respective DIP bodies as they descend in alignment under the influence of gravity. Outer sides of the DIP bodies are slidably constrained against overlapping one another (despite flashing) by vertically disposed bars 58 which, as will be described, constitute yieldable means defining a manually adjustable side and minimally acceptable passageway of the respective raceway channels. For this purpose, upper and lower ends of the bars 58 are yieldably urged away from the DIP bodies by springs 60 respectively carried by bolts 62 threaded into bores formed in cross-bars 64,66 affixed to the plate 54. Working against the springs 60 to urge the respective bars 58 toward the outer sides of the DIP bodies for suitably adjusted sliding contact therewith is a pair of graded, individually rotatable cams 68,68 (FIGS. 1–3 and 5–8). Each cam 68 is preferably formed with flat faces 70 circumferentially arranged, and disposed at different radial distances from the axis of a shaft 72 on which the cam is rotatably mounted. The arrangement is such that the horizontal shafts 72,72 are supported by lugs formed on the plate 54, and radially corresponding ones of the faces 70 are positioned to abut recessed upper and lower cam surfaces 74 (FIGS. 6–9) formed in vertically spaced portions of a front face of each bar 58.

For conveniently enabling the respective channels to be kept loaded with aligned DIP components, there is secured to the upper end portion of the raceway plate 54 an adaptor block 76 (FIGS. 5-7) having forwardly extending, equally spaced ribs 78 (FIG. 5) for defining receiving channels aligned with and leading into the raceway channels. Each of these adaptor channels preferably includes a T-shaped member 80 (FIGS. 6,7) the central leg of which extends between and detachably holds opposite lower portions of a component supplier's transparent so-called "stick" 84, which is adapted slidably to hold DIP's aligned in end-on-end relation for feeding under the influence of gravity. Front ends of the ribs 78 are spanned by a bar 81 which is bored to receive spring-loaded stick retainers 82 (FIG. 6) respectively having tapered portions arranged to engage and urge the outer side of the component stick 84 loosely and slidably against the center leg of the respectively opposed T-member 80. For detachably holding upper ends of the individual sticks 84 in their upright positions, spaced spring-clips 86 are secured to a horizontal bar 88 mounted on a pair of vertical supports 90 affixed at their lower ends, respectively, to the plate 54.

As will next be described, a picker assembly generally designated 100 (FIGS. 3–9D) is automatically movable laterally in the machine 20, according to pre-programmed control means 30, successively to receive selected DIP's releasable from the lower delivery ends of the respective raceway channels, the assembly actuating component escapement mechanism subsequently to be explained. The assembly 100 thereupon delivers the selected DIP into novel lead conditioning means associated with the inserting head 22, the machine automatically making certain checks as to component availability and condition to insure that the head and the cut-clinch mechanism 28 can thereafter continuously function as intended.

Figure 6:
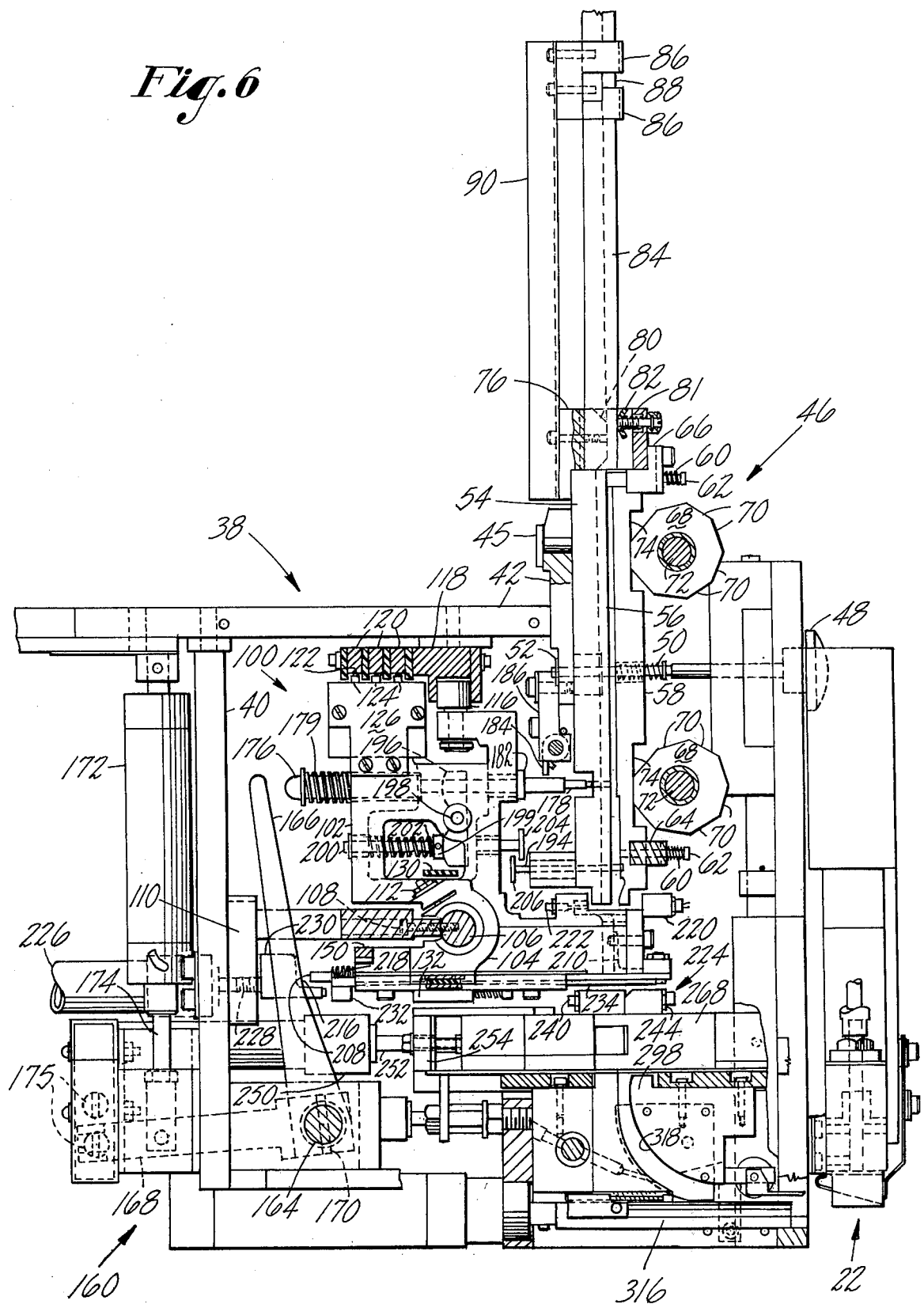
FIG. 6 is a view in side elevation of the mechanism shown in FIG. 5 with portions in section and showing the picker assembly about to automatically cooperate with a selected one of the escapement levers shown in FIG. 5 and a corresponding magazine channel.
Figure 7:
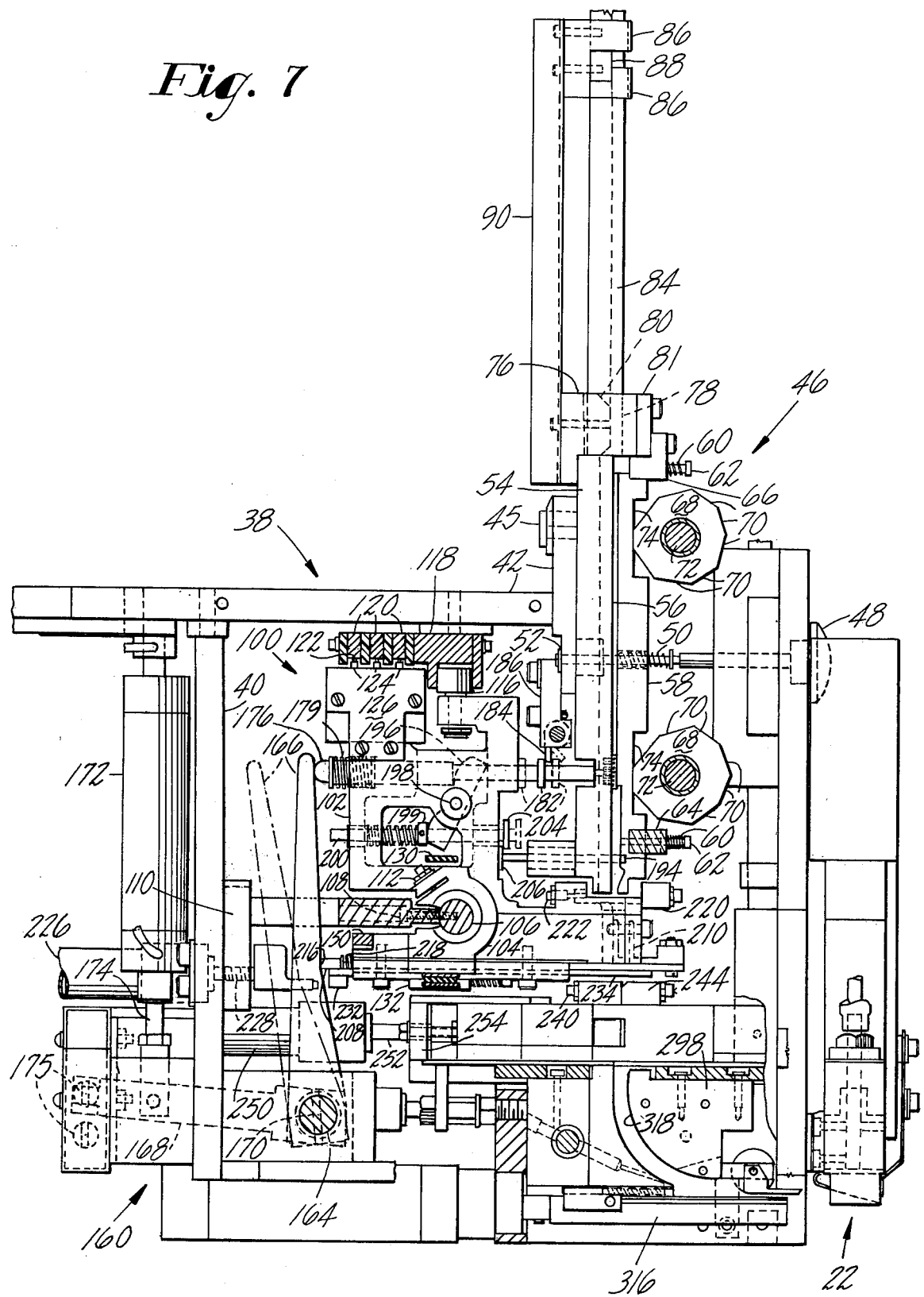
FIG. 7 is a view similar to FIG. 6 but showing parts at the next stage wherein one endmost component is being released from a raceway channel to the picker assembly, and a next-to-endmost component is clamped in the channel.
Figure 8:
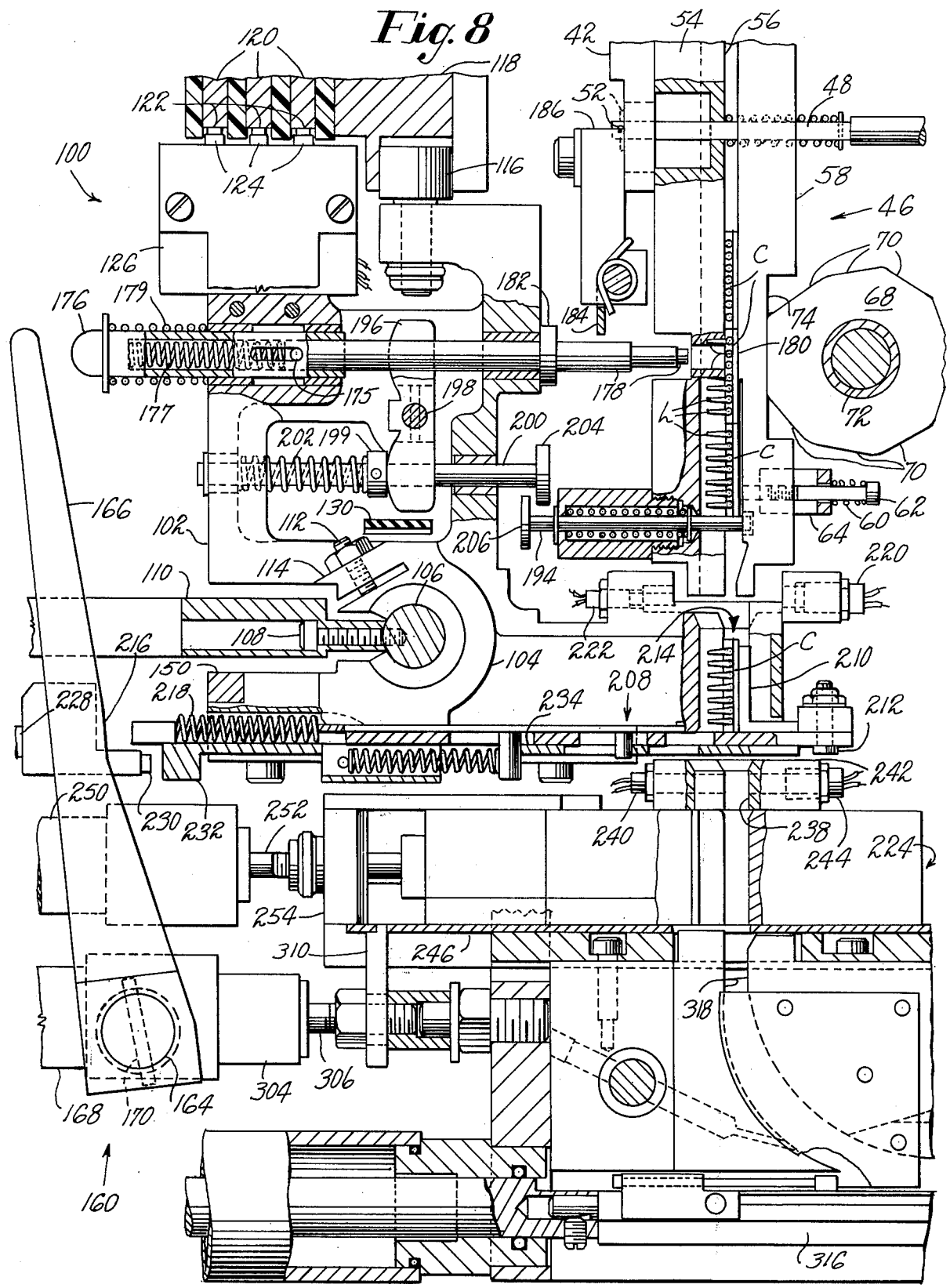
FIG. 8 is a view similar to the lower portion of FIGS. 6 and 7, and on a large scale, showing a component to be released from the laterally shifted picker assembly to lead forming and inserting mechanism.

The picker assembly 100 comprises a generally upstanding rectangular-shaped block 102 having, at its base, an integral transversely extending split cylindrical bearing sleeve portion 104 slidable axially on a stationary guide 106, the front of which is largely cylindrical in section. This guide or rod 106 extends substantially the length of the plate 40 and is secured along its length by a series of bolts 108 (FIGS. 6–8) to a bracket 110 projecting horizontally from the plate 40. As indicated in FIG. 8, a take-up or binder bolt 112 threaded into a split clamp portion 114 of the sleeve 104 may be used to suitably adjust sliding friction of the assembly 100 with the rod 106. For further guiding the assembly 100, a roll 116 journalled in the upper end of the block 102 for rotation about a vertical axis is arranged to engage the walls of a laterally extending slot formed in a guide block 118. The block 118 is secured to the underside of the support 42. Secured in parallel relation to a rear side of the block 118 is an insulated holder for three laterally extending bus bars 120. By means of the bars 120 electrical energy is continuously supplied, during machine operation, via brushes 122 mounted in brush-holders 124 and respectively in contact with the bars, as shown in FIGS. 6–8, via wires (not shown) to light sources of certain component detecting means hereinafter to be mentioned. A terminal 126 for the wires and connecting them conductively to the brushes is secured on the block 102.

Figure 4:
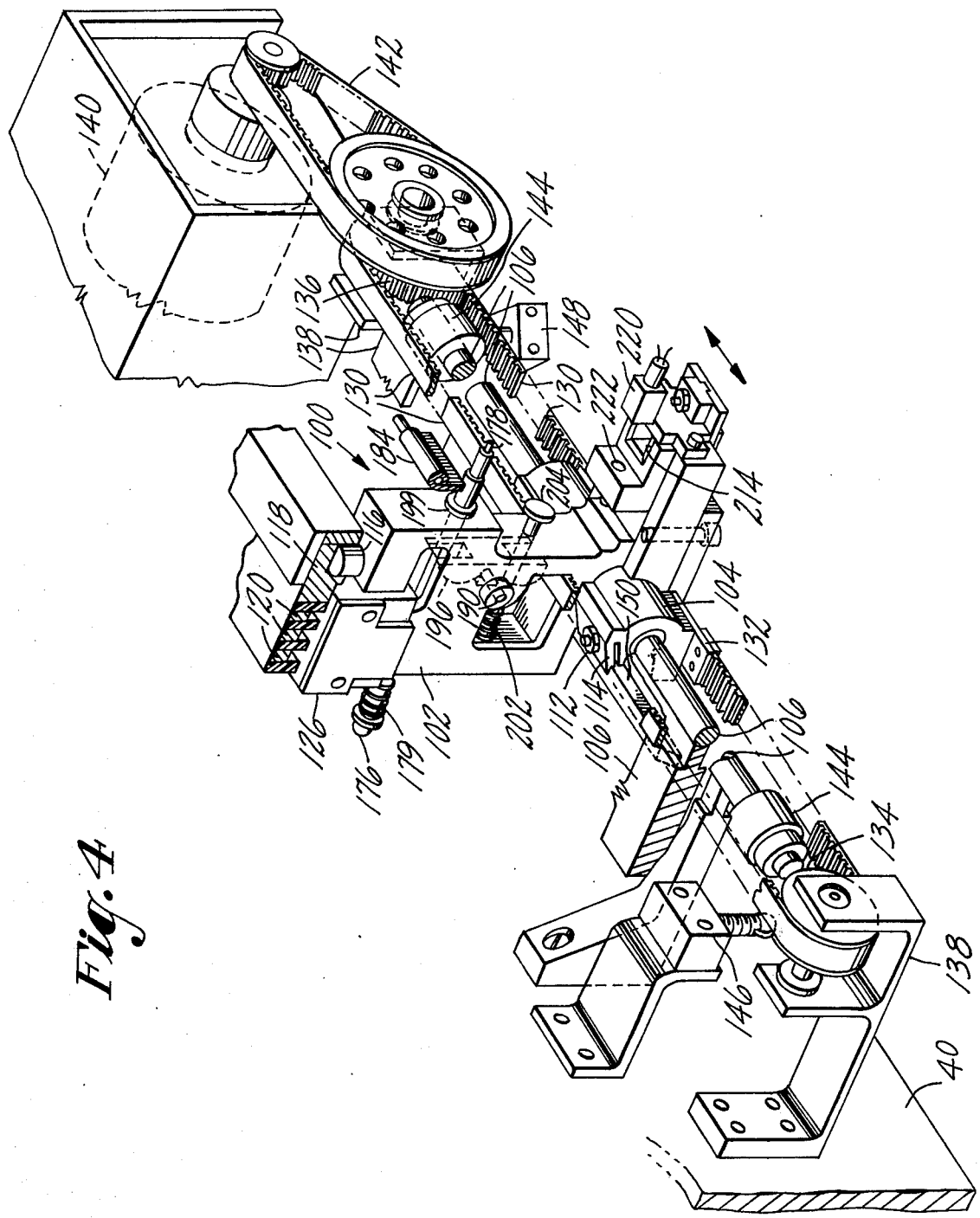
FIG. 4 is a perspective, with portions broken away, of the picker assembly, its guide means, and the power means including a belt drive shown in FIG. 3.

For driving the picker assembly 100 in shuttle-like fashion, the lower reach of an endless timing belt 130 (FIGS. 3–9D) is secured to a rear under portion of the block 102 as by means of a pair of clamping-plates 132 (FIG. 4) and suitable fasteners extending through the plates 132. The upper reach of the belt 130 passes through an opening in the block 102. As shown in FIG. 4 the belt extends over spaced pulleys 134,136 which are respectively rotatably supported by brackets 138 anchored at their inner ends to the plate 40. The pulley 136 is rotatably driven by means of a reversible motor 140 and an interconnecting endless drive belt 142, the motor being continuously under programmed control of the means 30. Rubber bumper sleeves 144,144 affixed to opposite ends of the rod 106 may be used to coact with opposite ends, respectively, of the sleeve portion 104, in cushioning picker assembly travel beyond limit switches 146,148 (FIG. 4) in the event of an electric circuit defect or failure for some reason. The power shut-off switch 146 is secured by a bracket to the plate 40 and disposed to have its contact engaged by the left-hand bevelled end of an actuating arm 150 fast on the lower back end of the block 102. The bevelled right-hand end of the arm 150 is similarly disposed, in the event of over-travel of the picker assembly 100, to engage and actuate the contact of the power shut-off switch 148.

Referring now mainly to FIGS. 5–9D, further description of details of the picker assembly 100 will be made having particular regard to its component escapement functions upon operation of actuating means, generally designated 160 (FIGS. 2,3,5–9), next to be described. Since the escapement actuating means 160 disposed to the right of the inserting head is a duplicate of the means 160 to the left thereof, each means servicing a pair of magazines 46, or in this case 30 raceway channels, only one of the two means 160 will next be described. Carried by spaced lugs 162 extending forwardly from lower portions of the plate 40 is a rotatable rod 164 substantially coextensive with and parallel to, about one-half of the guide rod 106. Upwardly extending arms 166,30 in number in this example, are uniformly spaced upon and secured for rotation with the rod 164. At about mid-length of the rod 164 a rearwardly extending actuating arm 168 is secured to the rod 164 by a pin 170 (FIG. 7). For rotating the rod 164 and its arms 166, upon actuating signal being received from the control means 30 that the picker assembly 100 has arrived at a predetermined position laterally as determined by the means 30 for receiving a selected DIP to be conditioned and delivered to the inserting head 22, a double-acting air cylinder 172 (FIGS. 5–7) provided with a depending piston rod 174 is connected pivotally to the arm 168. Accordingly, comparing FIGS. 6 and 7, upward movement of the piston rod will rotate and fulcrum rod 164 and all its arm 166 clockwise about the axis of the rod 164, thus causing the upper ends of the arms 166 to swing forwardly. Rotation limits for the rod 164 are determined by heightwise spaced switch contacts 175,175 (FIG. 5) engageable by the rear end of the arm 168. That arm 166 which is then aligned with a spring-retracted plunger 176 carried in a bore of the assembly 100 for slidable fore and aft movement will be effective to yieldably and forwardly shift the plunger and an aligned plunger probe fitted with a reduced rubber detent end 178 projectable endwise through an aligned one of a series of laterally disposed holes 180 (FIG. 8) formed in the respective magazine lands 56 as shown in FIG. 7. Accordingly, a next-to-endmost DIP will be clamped in the raceway channel to retain other DIP's above. The other arms 166 not then aligned with the plunger 176 also move forwardly but for no effective purpose while the picker assembly occupies that particular lateral position for receiving the selected endmost DIP as subsequently described. The plunger-probe 178 is formed with a collar 182 limiting rearward movement of the plunger-probe when solely acted on by the return spring on the plunger.

Preferably the probe 178 has a pin 175 (FIG. 8) transversely secured therein and slidable axially in an elongated slot in the plunger 176. A compression spring 177 nested in a bore in the plunger 176 and bearing on the pin 175 to urge the plungers 176,178 apart will allow a DIP to be yieldingly clamped in the arm 166. The further compression of the springs 177 and 179 allows subsequent operation of other portions of the escapement mechanism as later explained.

The collar 182 also serves, provided the particular raceway channel being probed happens to contain no further DIP's, as indicated in FIGS. 7 and 9, to pivot an elongated switch-actuable arm 184 (FIGS. 4, 6–8) rotatably supported in aligned bores of laterally spaced brackets 186 affixed to the back of the plate 42. Thus, upon the channel becoming empty, an actuator 188 (FIGS. 1,9A) on an outer end of the arm 184 is caused, against the influence of a return torsion spring 190 (FIG. 8), to operate a switch 192 mounted on the end of the plate 42 and thereby at once stop the machine. This arrangement prevents a non-insertion by the machine of any of the various DIP's intended for circuit board mounting, the machine condition being readily corrected by a reloading of the empty raceway channel with appropriate DIP's.

When the plunger 176 is moved forwardly to urge the plunger-probe 178 into component detaining position as shown in FIG. 7, another spring-pressed detent 194 (one for each raceway channel) carried by the magazine 46 is simultaneously caused to be retracted to release the endmost DIP into the lower portion of the picker assembly 100 by means next described. The last portion of the forward motion of the plunger 176 causes its inner end to engage the upper end of a lever 196 pivoted at 198 in the assembly 100, and having its opposite ends forked, thereby to rotate the levers 196 clockwise as seen in FIGS. 7 and 8. Consequently, the lower end of the lever 196 bears on a collar 199 fast on a plunger 200 to move the latter rearwardly in aligned bores of the assembly and against the influence of a return spring 202 confined between a collar 199 and a back portion of the assembly 100. A front enlarged end portion 204 of the plunger 200 is therefore retracted and, by reason of overlapping engagement of the portion 204 with a button-like end 206 of the detent 194, the latter is caused to permit descent of the button-most DIP from its raceway channel and, when cleared by means next described, onto a forward portion of a clamping plate 208 (FIGS. 6–9D) having an L-shaped clamp portion 210 and a later mentioned depending pin 212.

Figure 10:
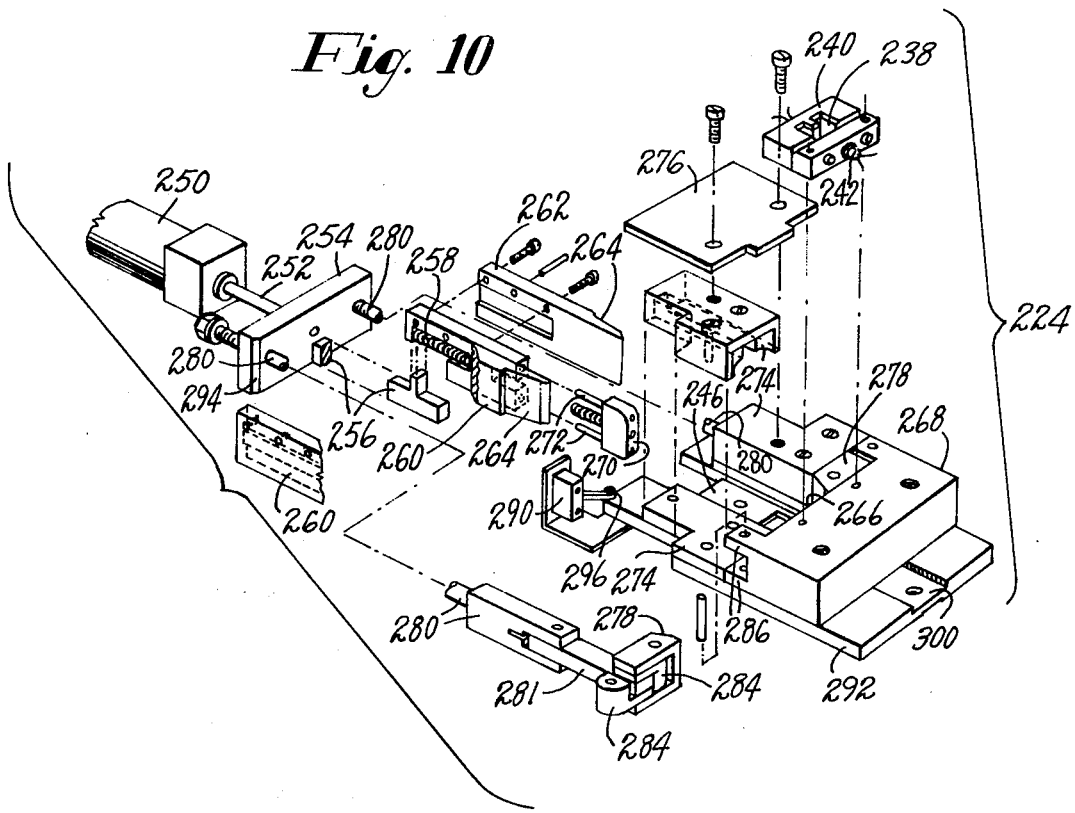
FIG. 10 is an exploded perspective view of lead forming parts.

Descent of the released component into a yieldingly held-closed pocket 214 of the picker assembly 100 and thus onto the plate 208 is simultaneous with pocket opening which is effected by the aforementioned forward pivotal movement of the acting one of the arms 166 operating the escapement means above described. For this purpose an intermediate portion 216 (FIG. 9B) of that arm engages a rear end of the plate 208 and displaces its clamp portion 210 forwardly to component receiving position shown in FIG. 7 and against the resistance of a return spring 218. Passage of the DIP momentarily intercepts light from a source 220 affixed to the assembly 100 and directed toward a light responsive cell 222 mounted on the block 102. Accordingly, this component delivery check serves, upon occurrence of a "light-dark-light" sequence, to signal the electrical control system not to hold up the picker assembly movement; conversely, if the detection is merely of "light," or "light to no-light," the machine will not further function until the component feeding condition is corrected. With the picker assembly 100 loaded as shown in FIG. 9B, the arms 166 all return counterclockwise (as viewed in FIGS. 6–8), and the clamp portion 210, by influence of the spring 218, thereupon engages the received component body to securely hold it against the block 102 and positioned for transfer laterally by the assembly 100 (see FIG. 9C), and then further descent from the pocket 214 into aligned lead conditioning mechanism generally designated 224 (FIGS. 10–12) soon to be described, the means 30 again automatically controlling lateral movement and positioning of the assembly 100.

When the selected component in the assembly 100 arrives above and in register with the center-line of the lead conditioning means 224 (FIGS. 9C,D, 11 and 12), a signal is given automatically whereupon a cylinder 226 is energized to urge its piston rod 228 forwardly. A rubber bumper 230 carried by the rod 228 then abuts a block 232 formed on the underside of a gate 234 slidable fore and aft beneath the clamping plate 208, the gate being movable in a guideway formed on the block 102. Forward displacement of the gate causes its front end to abut and yieldingly displace the pin 212 forwardly thus releasing the selected DIP from the clamping portion 210 and allowing the component to drop through a rectangular slot 236 (FIGS. 9–12) in the gate 234 as shown in FIG. 9D. The DIP falls through an opening 238 (FIGS. 10–12) defined by a sensing cell 240 a block 242 mounting a light source 244 directed toward the cell. Accordingly, the presence of a DIP delivered to the mechanism 224 upon a former gate 246 (FIGS. 8–12) is detected by momentary interception of a beam by the DIP.

It has hitherto been experienced that outward spreading of opposed rows of leads L by a member coming therebetween and acting somewhat as a wedge will occasionally be apt to cause a jamming of the mechanism with consequent necessity to cease operations until clearance is attained. The ensuing delay can be costly. Moreover, the known prior lead straightening means lacked an ability to cater for a range of component body thickness such as may be due to flashing occurring on the body molding or the like.

Referring mainly to FIGS. 10–13, the mechanism 224 comprises a double-acting actuating cylinder 250 responsive to the "component present" signal from the cell 240. The cylinder 250 has its piston rod 252 coupled to a cross bar 254 centrally formed with a forwardly projecting pusher portion 256. The latter extends behind one end of a spring 258 confined in a recess of one of a pair of inside formers 260,262 that are laterally spaced so that tapering forward portions 264,264 can respectively yieldingly enter the space on either side between a selected DIP body and its rows of leads. To insure that the body is initially positioned with its outer face abutting a fixed vertical inner wall 266 (FIG. 10) of a forming block 268, a spring-pressed block 270 fitted with parallel pins 272,272 slidable in bores formed in the inside former 260 is provided. The arrangement accordingly in such that, with a body thus confined, the tapered portions 264, respectively guided by parallel ways formed in guide blocks 274,274 secured by a cover plate 276, enter between the lead rows and, if necessary because of their deviance from a usual approximately 7° or 8° divergence, respectively urge them outwardly to, but not beyond, a desired insertion position. While thus engaging the inner sides of the leads, a pair of outside U-shaped formers or pressers 278,278 having correspondingly divergent lead engaging faces substantially parallel to the confronting tapered portion 264 is caused to move laterally inward for cooperation with the inside former portions 264, respectively. For this purpose there is a parallel pair of push-rods 280,280 secured to the cross bar 254, forward ends of the rods each pivotally carrying a link 281 fitted at its free end with a toggle hinge pin 282 (FIG. 12). An outer end of one toggle link 284 of each pair is pivoted on a pin mounted in ears 286 formed on the forming block 268, and the other laterally movable toggle link is pivoted on the hinge pin and pivotally supports one of the mentioned lead pressers 278.

Figure 11:
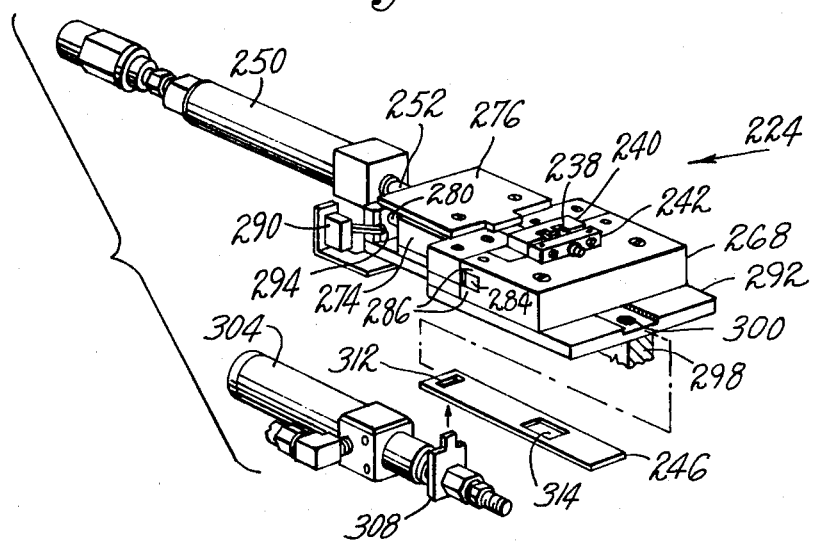
FIG. 11 is a perspective view of the parts shown in FIG. 10 when assembled.

When the cross bar 254 moves forwardly to straighten the toggles 284,278 and confine and straighten opposite rows of leads between the inwardly acting pressers 278 and the tapered portions 264, respectively, the leads cannot become jammed therebetween since there is accurate parallelism between the coacting lead engaging faces. As straightening occurs, a switch 290 (FIGS. 10-12) bracketed to a supporting plate 292 for the forming block 268 is actuated by engagement of a bevelled corner 294 of the bar 254 with a contact 296 of the switch 290 as shown in FIGS. 11 and 12. The plate 292 is secured on a frame member 298 and has a recess 300 in its upper surface for slidably accommodating fore and aft motion of the horizontal former gate 246. Actuation of the switch 290 energizes a circuit to actuate a motor 304 (FIGS. 8, 11) whereby its piston rod 306 is rearwardly retracted against a return spring (not shown) thus causing a latch 308 (FIG. 11) secured on the rod and mating with a hole 312 (FIG. 11) in the former gate to retract the latter. As a consequence, a larger opening 314 in the former gate 246 is now aligned with the conditioned DIP which is then being released, due to rearward movement of the piston rod 252, and the DIP is allowed to descend onto a transfer mechanism 316 (FIGS. 8, 9) (for instance of the general type shown in U.S. Pat. Nos. 3,591,040 and 3,550,238) via a curved chute 318.

The selected DIP is then presented beneath the inserting means 22 and, upon signal from the control means 30, the leads L are thrust through the circuit board receiving holes and projecting lower lead ends are automatically cut and clinched by the mechanism 28.

Upon transfer of the selected DIP to the board B, the computer directs the assembly 100 to again move, in a repetitive cycle, to the next raceway channel to the right or left of the head 22 for releasing, receiving and transferring, as above explained, the next predetermined DIP to be inserted. Each DIP selected is thus not only assured of prompt, accurate delivery, but its leads will be correctly positioned, without jamming, by the means 224 with respect to the component body to insure endwise lead insertion. It will be appreciated from the foregoing that an operator, in addition to keeping the sticks 84 loaded, may only need occasionally to turn the cams 68 to insure continuous supply of the DIP's.

Having thus described my invention, what I claim as new and desire to secure by Letters Patent of the United States is:

1. In combination with a component inserting machine having means for inserting components provided with in-line leads, a plurality of raceways for supplying the components to be inserted, a cross-slide means for locating a circuit board relative to the inserting means, and a computer controlled means for automatically operating the inserting means and the cross-slide means according to predetermined program, a movable picker assembly responsive to the computer controlled means for selecting successive predetermined components from the respective raceways according to said program and delivering them individually to the inserting means, said picker assembly comprising component escapement means including a detent arranged to cooperate with the raceways, respectively, mechanism for operating the detent of said escapement means comprising a plurality of actuating arms, and a power means responsive to the computer controlled means when the picker is in predetermined position for causing one of said arms to release each selected component in succession to the picker assembly.

2. The combination of claim 1 wherein the actuating arms are mounted on a common shaft for limited rotation therewith and effective actuation of the escapement means by a predetermined one of said arms.

3. The combination of claim 2 wherein the picker assembly comprises a block slidably mounting a pair of spring-pressed plungers both of which are arranged for potential operative engagement with each of said arms, one of the plungers being disposed to control said detent, and the other of the plungers being disposed to be displaced by the arms, respectively, to a component-releasing, yieldingly held-open position.

4. The combination of claim 1 wherein the picker assembly is driven by a belt directly connected thereto for movement along a path adjacent to the delivery ends of the respective raceways and said component inserting means, said assembly includes a pocket for accommodating each selected component, and a locking means in said assembly is arranged to be operable by said one of the actuating arms to relesably secure and position the selected component in said pocket.

5. The combination of claim 1 wherein one of the detents in the spring-pressed plunger movable transversely into the respective cooperating raceways, that detent serving as a yieldable probe for detecting the presence of a component just above the delivery end of each of the raceways, and a circuit including a switch operable by the plunger when it fails to engage a component in the raceway to render the machine inoperative.

6. The combination of claim 1 wherein the picker assembly comprises an actuating means operable by movement of the detent in one direction to clamp a component in a raceway above its delivery end, and a spring plunger for yieldably retaining an endmost component in the raceway, said actuating means being arranged, in response to movement of the detent in said one direction, to cause said plunger to release the endmost component.

7. The combination of claim 1 wherein, intermediate a component delivery position of said picker assembly and the inserting means, there is a lead conditioning means, said lead conditioning means comprising a pair of inside formers respectively adapted to be received between the opposite sides of each component body to be delivered and an adjacent row of its generally in-line leads, and a pair of outside formers movable inwardly against the outer surfaces of the leads and toward the inside formers, the lead-engaging faces of the inside and outside formers being substantially parallel in lead pressing relation whereby jamming of the component is avoided.

8. The combination of claim 7 wherein operation of the lead conditioning means is responsive to said computer controlled means.

9. In a machine for inserting in-line lead components, means for inserting successive components with their leads uniformly extending in divergent rows from opposite sides of their respective component bodies, and lead conditioning mechanism for straightening the leads of each row of a component prior to its delivery to said means, said mechanism comprising a fixed member engageable with the component body, spaced, tapering forming means having faces respectively yieldingly engageable with the inside surfaces of the leads of each row, a spring-pressed member mounted on said forming means for engaging the body to position it against said fixed member prior to lead engagement by said tapering forming means, outside forming means having lead engaging faces respectively substantially parallel to those of said forming means, and mechanism for moving the outside forming means inwardly to press the rows of leads against said faces of the tapering forming means.

10. A machine as in claim 9 wherein the outside forming means is actuatable inwardly by a toggle arrangement.

11. A machine as in claim 9 wherein a single power actuatable mechanism is provided for operating in sequence the body positioning member, the tapering inside lead forming means, and then the outside forming means, said power actuatable mechanism being reversible to release the component after its leads are straightened.

* * * * *